US012787335B2

(12) United States Patent
Bureau-Oxton et al.

(10) Patent No.: US 12,787,335 B2
(45) Date of Patent: Nov. 3, 2026

(54) SCANNING SINGLE ELECTRON TRANSISTOR HAVING A PLUNGER GATE OVER FIN

(71) Applicant: International Business Machines Corporation, Armonk, NY (US)

(72) Inventors: Chloé Bureau-Oxton, Adliswil (CH); Armin Knoll, Adliswil (CH); Patrick Harvey-Collard, Adliswil (CH)

(73) Assignee: International Business Machines Corporation, Armonk, NY (US)

(*) Notice: Subject to any disclaimer, the term of this patent is extended or adjusted under 35 U.S.C. 154(b) by 441 days.

(21) Appl. No.: 18/495,830

(22) Filed: Oct. 27, 2023

(65) Prior Publication Data

US 2025/0142858 A1 May 1, 2025

(51) Int. Cl.

| | |
|---|---|
| ***H10D 30/40*** | (2025.01) |
| ***G01Q 60/40*** | (2010.01) |
| ***H10D 30/01*** | (2025.01) |
| ***H10D 62/10*** | (2025.01) |

(52) U.S. Cl.

CPC ........... *H10D 30/402* (2025.01); *G01Q 60/40* (2013.01); *H10D 30/014* (2025.01); *H10D 62/118* (2025.01)

(58) Field of Classification Search

CPC ... H10D 30/402; H10D 30/014; H10D 62/118
See application file for complete search history.

(56) References Cited

U.S. PATENT DOCUMENTS

| | | | | |
|---|---|---|---|---|
| 11,990,516 | B1 * | 5/2024 | George | H10D 62/812 |
| 2008/0016953 | A1 | 1/2008 | Suh et al. | |
| 2023/0217840 | A1 * | 7/2023 | Patomaki | H10D 64/27 327/527 |

(Continued)

FOREIGN PATENT DOCUMENTS

| | | | |
|---|---|---|---|
| KR | 20060000809 | A | 1/2006 |
| KR | 100696870 | B1 | 3/2007 |

OTHER PUBLICATIONS

Bermeister et al., "Charge noise, spin-orbit coupling, and dephasing of single-spin qubits." Applied Physics Letters 105.19 (2014): pp. 1-6.

(Continued)

*Primary Examiner* — Michael Jung
(74) *Attorney, Agent, or Firm* — Cantor Colburn LLP; Samuel Waldbaum

(57) ABSTRACT

Embodiments of the present disclosure are directed to a side-gated fin field effect transistor configured as a scanning single electron transistor. In a non-limiting embodiment, a scanning single electron transistor includes a fin formed over a substrate. A source gate is formed over a first portion of the substrate that extends over a sidewall of the fin. A drain gate is formed over a second portion of the substrate that extends over the sidewall of the fin. A plunger gate is formed over a third portion of the substrate that extends over the sidewall of the fin. The plunger gate is positioned between the source gate and the drain gate. The plunger gate is etched back from a topmost surface of the fin such that a quantum dot formed in the fin is not screened by metallic materials in the plunger gate.

20 Claims, 7 Drawing Sheets

(56) References Cited

U.S. PATENT DOCUMENTS

2024/0127098 A1* 4/2024 Gonzalez-Zalba ....... H01P 7/08

OTHER PUBLICATIONS

Brenning et al., "A Single Electron Transistor on an Atomic Force Microscope Probe", Nano Letters 6, (2006): pp. 937-941.
Camenzind et al. "A hole spin qubit in a fin field-effect transistor above 4 Kelvin." Nature Electronics 5.3 (2022): 178-183 .
Ella et al., "Simultaneous Voltage and Current Density Imaging of Flowing Electrons in Two Dimensions", Nature Nanotechnology 14, (2019), 33 pages.
Geyer et al., "Self-Alighed Gates for Scalable Silicon Quantum Computing", Applied Physics Letters 118, (2021). 104004-1 to 104004-6.
Honig et al. "Local electrostatic imaging of striped domain order in LaAIO3/SrTiO3." Nature materials 12.12 (2013): pp. 1112-1118.
Ilani et al., "The Microscopic Nature of Localization in the Quantum Hall Effect", Nature 427, (2004): pp. 328-332.
Itakura et al., "Dephasing due to background charge fluctuations." Physical Review B Phys Rev B 67 (2003): 195320.
J.P. Nacenta Mendivil "Direct Imaging of Electrical Fields Using a Scanning Single Electron Transistor", PhD Thesis, Universié Grenoble Alpes (2019): 197 pages.
Kuhlmann et al., "Ambipolar Quantum Dots in Undoped Silicon Fin Field-Effect Transistors", Applied Physics Letters 113, (2018), 5 pages.
Kumar et al. "Imaging hydrodynamic electrons flowing without Landauer-Sharvin resistance." Nature 609 (2022): 276-281.
Lansbergen et al., "Gate-Induced Quantum-Confinement Transition of a Single Dopant Atom in a Silicon FinFET", Nature Physics 4, (2008): pp. 656-661.
Martin et al., "Observation of Electron-Hole Puddles in Graphene Using a Scanning Single-Electron Transistor", Nature Physics 4, (2008): pp. 144-148.
Müller et al., "Towards understanding two-level-systems in amorphous solids: insights from quantum circuits." Reports on Progress in Physics 82.12 (2019): 134 pages.
Ramon et al., "Decoherence of Spin Qubits Due to a Nearby Charge Fluctuator in Gate-Defined Double Dots", Physical Review B 81, 045304 (2010). 19 pages.
Rychen et al. "A low-temperature dynamic mode scanning force microscope operating in high magnetic fields." Review of Scientific Instruments 70.6 (1999): 5 pages.
Su et al., "A sensitive charge scanning probe based on silicon single electron transistor." Journal of Semiconductors 37.4 (2016): pp. 044008-1 to 044008-4.
Suh, M. S., et al. "Surface potential imaging in oxide-nitride-oxide-silicon structure using a field effect transistor cantilever." Sensors and Actuators A: Physical 136.2 (2007): 597-603.
Sulpizio et al., "Visualizing Poiseuille Flow of Hydrodynamic Electrons", Nature 576, (2019), 31 pages.
Suter et al., "Integration of a Fabrication Process for an Aluminum Single-Electron Transistor and a Scanning Force Probe for Tuning-Fork-Based Probe Microscopy", Journal of Microelectromechanical Systems 19, (2010), pp. 1088-1097.
Yacoby et al. "Electrical Imaging of the Quantum Hall State", Solid State Communications III, 1999: pp. 1-13.
Yoo et al., "Scanning Single-Electron Transistor Microscopy: Imaging Individual Charges", Science 276, (1997): pp. 579-582.
Zhitenev et al. "Imaging of localized electronic states in the quantum Hall regime." Nature 404.6777 (2000): 473-476.
Zondiner et al., "Cascade of Phase Transitions and Dirac Revivals in Magic-Angle Graphene", Nature 582, (2020), pp. 203-208.

* cited by examiner

SCANNING SINGLE ELECTRON TRANSISTOR HAVING A PLUNGER GATE OVER FIN

BACKGROUND

The present disclosure generally relates to fabrication methods and resulting structures for semiconductor devices, and more specifically, to processing methods and resulting structures for providing a scanning single electron transistor (SET).

Single electron transistors (SETs) are nanoscale electronic devices that leverage the discrete nature of electron charge to control electrical conduction at the single-electron level. SETs typically consist of a small metallic island, connected to source and drain electrodes via tunnel junctions, and a gate electrode, which can influence the electrostatic potential of the island. One key operational principle of SETs is the Coulomb blockade effect, which arises due to the energy cost associated with adding or removing an electron from the island. In the Coulomb blockade regime, the energy required to transfer an electron onto the island is greater than thermal energy (kT), where 'k' is the Boltzmann constant and 'T' is temperature. As a result, the island becomes "blocked" to electron transport. When the electrostatic potential on the island is modulated by the gate voltage, the energy barrier can be overcome, allowing for the controlled flow of single electrons, thereby enabling transistor-like behavior.

SETs integrated into scanning probes are versatile tools, with applications ranging from materials science to nanoelectronics. SETs can be employed to investigate the electronic properties of various materials and to examine the behavior of novel nanoscale devices. SETs integrated onto scanning probes have been instrumental in exploring localized charges and electron transport phenomena at the nanoscale. By positioning the SET probe tip close to a sample, it is possible to detect and manipulate the charge on the nanometer scale. These devices have also found applications in fields such as quantum dot imaging, quantum information processing, and the investigation of mesoscopic conductors.

SUMMARY

Embodiments of the disclosure are directed to a scanning single electron transistor. A non-limiting example of the scanning single electron transistor includes a fin formed over a substrate. A source gate is formed over a first portion of the substrate that extends over a sidewall of the fin. A drain gate is formed over a second portion of the substrate that extends over the sidewall of the fin. A plunger gate is formed over a third portion of the substrate that extends over the sidewall of the fin. The plunger gate is positioned between the source gate and the drain gate. The plunger gate is etched back from a topmost surface of the fin such that a quantum dot formed in the fin is not screened by metallic materials in the plunger gate.

Embodiments of the disclosure are directed to a tuning-fork-based scanning probe. A non-limiting example of the tuning-fork-based scanning probe includes a holding chip having a cantilever, a tuning fork coupled to a bottom surface of the holding chip, and a scanning single electron transistor on a tip of the cantilever. The scanning single electron transistor includes a fin formed over a substrate and a source gate formed over a first portion of the substrate that extends over a sidewall of the fin, a drain gate formed over a second portion of the substrate that extends over the sidewall of the fin, and a plunger gate formed over a third portion of the substrate that extends over the sidewall of the fin. The plunger gate is positioned between the source gate and the drain gate. The plunger gate is etched back from a topmost surface of the fin such that a quantum dot formed in the fin is not screened by metallic materials in the plunger gate.

Embodiments of the disclosure are directed to a method for providing scanning single electron transistors. A non-limiting example of the method includes forming a fin over a substrate. The method includes forming a dielectric layer over the substrate and a surface of the fin and depositing conducting material on top of the dielectric layer. The method includes forming a source gate, a drain gate, and a plunger gate by etching the conductive material such that the source gate, the drain gate, and the plunger gate each extend up sidewalls and over a top of the fin. The method includes removing portions of the plunger gate from a topmost surface of the fin such that a quantum dot formed in the fin is not screened by metallic materials in the plunger gate.

Additional technical features and benefits are realized through the techniques of the present disclosure. Embodiments and aspects of the disclosure are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the disclosure are apparent from the following detailed description taken in conjunction with the accompanying drawings in which:

Figure 1:
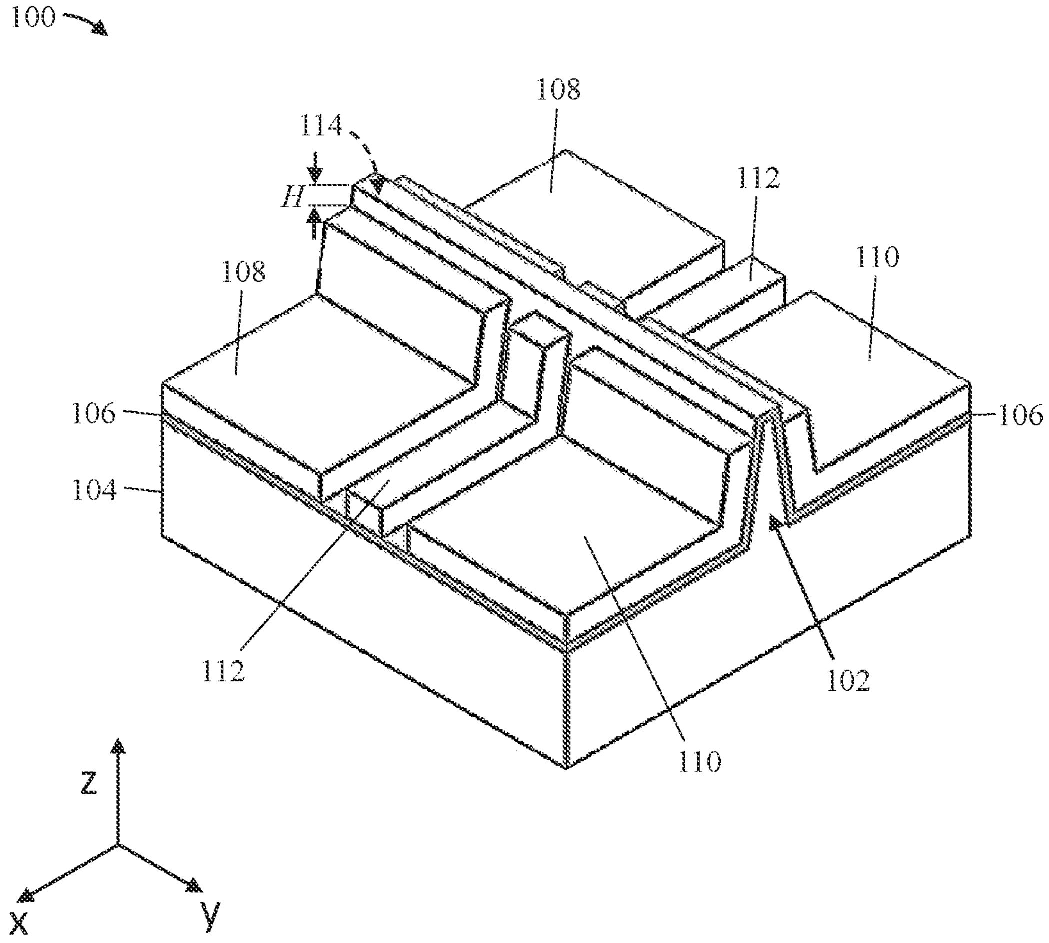
FIG. 1 is a view of a scanning single electron transistor in accordance with one or more embodiments of the disclosure.

The diagrams depicted herein are illustrative. There can be many variations to the diagram or the operations described therein without departing from the spirit of the disclosure. For instance, the actions can be performed in a differing order or actions can be added, deleted or modified.

In the accompanying figures and following detailed description of the described embodiments of the disclosure, the various elements illustrated in the figures are provided with two or three-digit reference numbers. With minor exceptions, the leftmost digit(s) of each reference number correspond to the figure in which its element is first illustrated.

DETAILED DESCRIPTION

According to an aspect of the disclosure, there is provided a scanning single electron transistor. A non-limiting example scanning single electron transistor includes a fin formed over a substrate. A source gate is formed over a first portion of the substrate. The source gate extends over a sidewall of the fin. A drain gate is formed over a second portion of the substrate. The drain gate extends over the sidewall of the fin. A plunger gate is formed over a third portion of the substrate. The plunger gate extends over the sidewall of the fin. The plunger gate is positioned between the source gate and the drain gate. The plunger gate is etched back from a topmost surface of the fin such that a quantum dot formed in the fin is not screened by metallic materials in the plunger gate. Advantageously, the scanning single electron transistor configured as described provides a relatively higher operating temperature and spatial resolution than prior scanning single electron transistors.

In some embodiments, the scanning single electron transistor includes a dielectric layer directly on the substrate and directly on the fin. In some embodiments, the plunger gate, the source gate, and the drain gate are directly on the dielectric layer. The dielectric layer ensures electrical isolation between the gates and the two-dimensional electron gas that is accumulated at the interface between the substrate and the dielectric layer.

In some embodiments, a portion of the dielectric layer is exposed on the topmost surface of the fin. In some embodiments, the plunger gate, the source gate, and the drain gate are etched back from the topmost surface of the fin to a height of 10 nanometers. A 10 nanometer etch back prevents screening of the quantum dot by the metallic material of the gates.

In some embodiments, the fin includes a base portion having a first width and a top portion having a second width less than the first width. In some embodiments, the second width of the top portion is less than 20 nanometers. Advantageously, a tapered fin having a topmost (apex) width of less than 20 nanometers and plunger gates which extend relatively high (less the 10 nanometer etch back) up the fin sidewalls allows for the quantum dot to form higher towards the top of the fin structure.

According to an aspect of the disclosure, there is provided a tuning-fork-based scanning probe. A non-limiting example tuning-fork-based scanning probe includes a holding chip having a cantilever extending therefrom, a tuning fork coupled to a bottom surface of the holding chip, and a single electron transistor on a tip of the cantilever. The scanning single electron transistor includes a fin formed over a substrate. A source gate is formed over a first portion of the substrate. The source gate extends over a sidewall of the fin. A drain gate is formed over a second portion of the substrate. The drain gate extends over the sidewall of the fin. A plunger gate is formed over a third portion of the substrate. The plunger gate extends over the sidewall of the fin. The plunger gate is positioned between the source gate and the drain gate. The plunger gate is etched back from a topmost surface of the fin such that a quantum dot formed in the fin is not screened by metallic materials in the plunger gate. Advantageously, the tuning-fork-based scanning probe is leveraged to provide higher vertical resolution than prior scanning single electron transistors.

According to an aspect of the disclosure, there is provided a method for providing scanning single electron transistors. A non-limiting example of the method includes forming a fin over a substrate. The method includes forming a source gate over a first portion of the substrate, the source gate extending over a sidewall of the fin. The method includes forming a drain gate over a second portion of the substrate, the drain gate extending over the sidewall of the fin. The method includes forming a plunger gate over a third portion of the substrate, the plunger gate extending over the sidewall of the fin, the plunger gate between the source gate and the drain gate. The method includes removing portions of the plunger gate from a topmost surface of the fin such that a quantum dot formed in the fin is not screened by the metallic materials in the plunger gate. Advantageously, forming the scanning single electron transistor in this manner results in a final device having a relatively higher operating temperature and spatial resolution than prior scanning single electron transistors.

It is understood in advance that although example embodiments of the disclosure are described in connection with a particular transistor architecture, embodiments of the disclosure are not limited to the particular transistor architectures or materials described in this specification. Rather, embodiments of the present disclosure are capable of being implemented in conjunction with any other type of transistor architecture or materials now known or later developed.

For the sake of brevity, conventional techniques related to semiconductor device fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices are well known and so, in the interest of brevity, many conventional steps will only be mentioned briefly herein or will be omitted entirely without providing the well-known process details.

Turning now to an overview of technologies that are more specifically relevant to aspects of the present disclosure, semiconductor devices such as silicon metal-oxide-semiconductors (Si-MOSs) are fabricated in a series of stages, including a front-end-of-line (FEOL) stage, a middle-of-line (MOL) stage, and a back-end-of-line (BEOL) stage. The process flows for fabricating modern integrated circuits (ICs) are often identified based on whether the process flows fall in the FEOL stage, the MOL stage, or the BEOL stage. Generally, the FEOL stage is where device elements (e.g., transistors, capacitors, resistors, etc.) are patterned in the semiconductor substrate/wafer. The FEOL stage processes include wafer preparation, isolation, gate patterning, and the formation of wells, source/drain (S/D) regions, extension junctions, silicide regions, and liners. The MOL stage typically includes process flows for forming the contacts (e.g., CA) and other structures that communicatively couple to active regions (e.g., gate, source, and drain) of the device element. For example, the silicidation of source/drain regions, as well as the deposition of metal contacts, can occur during the MOL stage to connect the elements patterned during the FEOL stage. Layers of interconnections (e.g., metallization layers) are formed above these logical and functional layers during the BEOL stage to complete the IC. Most ICs need more than one layer of wires to form all the necessary connections, and as many as 5-12 layers are added in the BEOL process. The various BEOL layers are interconnected by vias that couple from one layer to another. Insulating dielectric materials are used throughout the layers of an IC to perform a variety of functions, including stabilizing the IC structure and providing electrical isolation of the IC elements. For example, the metal interconnecting wires in the BEOL region of the IC are isolated by dielectric layers to prevent the wires from creating a short circuit with other metal layers.

As discussed previously, single electron transistors (SETs) integrated into scanning probes are versatile tools, with applications ranging from materials science to nanoelectronics. SETs are extremely sensitive electrometers that can significantly enhance the capabilities of scanning probes by providing high sensitivity to charge.

Despite their remarkable sensitivity and versatility, SET-based scanning probes can suffer from a significant limitation in terms of spatial resolution. Typically, the spatial resolution of these probes is on the order of 100 nanometers or larger. This limitation arises from the relatively large size of the metallic island in the SET and the associated tunnel junctions, which restrict the fine localization of charges.

Another challenge with SETs is their low operating temperatures. These devices typically require operation at temperatures well below 1 Kelvin, close to absolute zero. Maintaining such extreme cooling conditions poses practical challenges and limits the accessibility of SETs in many experimental setups.

A silicon metal-oxide-semiconductor (Si-MOS) quantum dot (QD) fabricated on the tip of an atomic force microscope (AFM) cantilever is an interesting candidate for a scanning SET. Its potentially large charging energy and tunable tunnel barriers would allow a wide range of operating temperatures, while its small size would lead to improved spatial resolution. However, a major challenge to overcome is the presence of a metallic gate above the QD which screens it from electric fields, making it ineffective as a scanning electrometer.

This disclosure introduces new fabrication methods and resulting structures that leverage a non-planar, side-gated fin field effect transistor (finFET) as a scanning SET. By using a narrow fin geometry with inclined side walls, the metallic top gate typically associated with Si-MOS QDs can be removed to avoid electric field screening while still allowing for the formation of a QD at the top of the silicon fin.

In some embodiments, a scanning SET includes a finFET fabricated onto the tip of an atomic force microscope cantilever. In some embodiments, the device is a tall, narrow, semiconductor (e.g., silicon) fin with inclined side walls. Rather than relying upon a wrap-around plunger gate, the device has a pair of plunger gates that extend up the sides nearly to the top of the fin. The cantilever can be mounted onto a quartz tuning fork to allow precise control of the distance between the SET and the sample under test.

In some embodiments, the fin geometry is very narrow (as used herein, a very narrow fin is less than 20 nm at the top, for example 10 nm) and the side gates must extend almost to its top to ensure that a quantum dot forms in the fin despite the absence of a wrap-around plunger gate (for example, the metallic gates can be etched down to 10 nm below the top of the fin). Advantageously, the fact that the fin has inclined sidewalls ensures that the dot will preferentially form at the top of the fin, rather than all along its height.

Building scanning SETs from side-gated fin-type FETs in accordance with one or more embodiments described herein offers various technical advantages over existing implementations of scanning SETs. Notably, devices described herein offer a higher operating temperature (e.g., greater than 4 K) due to the relatively large charging energy of the QDs. Spatial resolution is also improved (e.g., less than 20 nm) due to the relatively small device size. These improvements will serve to increase the performance of scanning SETs as well as extend their fields of application. Other advantages are possible. For example, the electrical sensitivity of these devices is on the order of $10^{-5}$ e/Hz$^{1/2}$, comparing favorably to Al-based SETs on glass (~100 μV/Hz$^{1/2}$), carbon nanotubes (~$2 \cdot 10^{-5}$ e/Hz$^{1/2}$), and prior Al and Si-based SETs ($10^{-5}$ e/Hz$^{1/2}$ to $10^{-3}$ e/Hz$^{1/2}$). Distance control is also greatly improved, as such devices offer natively better control of the distance to the sample under test (e.g., less than 1 nm), comparing favorably to Al-based SETs on glass (~100 nm), carbon nanotubes (greater than 100 nm), and prior Al and Si-based SETs (~50 nm).

FIG. 1 depicts a view of a scanning single electron transistor 100 in accordance with one or more embodiments of the disclosure. As shown in FIG. 1, the scanning single electron transistor 100 includes a fin 102 formed on a substrate 104. The fin 102 and the substrate 104 can be made of any suitable semiconductor materials, such as, for example, monocrystal silicon, silicon germanium (SiGe), III-V compound semiconductor, II-VI compound semiconductor, or semiconductor-on-insulator (SOI). Group III-V compound semiconductors, for example, include materials having at least one group III element and at least one group V element, such as one or more of aluminum gallium arsenide (AlGaAs), aluminum gallium nitride (AlGaN), aluminum arsenide (AlAs), aluminum indium arsenide (AlIAs), aluminum nitride (AlN), gallium antimonide (GaSb), gallium aluminum antimonide (GaAlSb), gallium arsenide (GaAs), gallium arsenide antimonide (GaAsSb), gallium nitride (GaN), indium antimonide (InSb), indium arsenide (InAs), indium gallium arsenide (InGaAs), indium gallium arsenide phosphide (InGaAsP), indium gallium nitride (InGaN), indium nitride (InN), indium phosphide (InP) and alloy combinations including at least one of the foregoing materials. The alloy combinations can include binary (two elements, e.g., gallium (III) arsenide (GaAs)), ternary (three elements, e.g., InGaAs) and quaternary (four elements, e.g., aluminum gallium indium phosphide (AlInGaP)) alloys. In some embodiments, the substrate 104 and the fin 102 can be made of a same semiconductor material. In other embodiments, the substrate 104 can be made of a first semiconductor material and the fin 102 can be made of a second semiconductor material. For example, in some embodiments, the fin 102 and the substrate 104 are made of silicon.

In some embodiments, the fin 102 is a very narrow fin having a peak width (narrowest point, or top width) of less than 20 nm. For example, in some embodiments, the fin 102 has a height of 100 nm, a base width (broadest point, or bottom width) of 40 nm, and a peak width of 10 nm, although other configurations are within the contemplated scope of this disclosure. In some embodiments, the fin 102 is tapered such that the base width is greater than the peak width. In some embodiments, the peak width is at most 80 percent, or 75 percent, or 60 percent, or 50 percent, or 40 percent, or 25 percent, or 20 percent, or 10 percent, or 5 percent the base width, depending on the needs of a particular application. The fin 102 is shown in a substantially trapezoidal configuration, although other configurations, such as triangular fin configurations (with sub-1 nm apex widths) are possible and within the contemplated scope of this disclosure. The fin 102 can be etched into the substrate 104 using known processes, such as, for example, via photolithography and masking, a dry chemistry etch such as a reactive ion etch (RIE), and/or a wet chemistry etch.

As further shown in FIG. 1, the scanning single electron transistor 100 includes a dielectric layer 106 formed on a topmost surface of the fin 102 and the substrate 104. In some embodiments, the dielectric layer 106 is a high-quality, thermally-grown dielectric layer, such as, for example, a thermally-grown silicon dioxide layer. In some embodiments, the dielectric layer 106 is formed to a thickness of 0.5 to 15 nm, for example 10 nm, although other thicknesses are within the contemplated scope of this disclosure. In some embodiments, the dielectric layer 106 is a high-k dielectric film. The high-k dielectric film can be made of, for example, silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials can further include dopants such as lanthanum and aluminum.

The scanning single electron transistor 100 further includes source gates 108 and drain gates 110, configured and arranged as shown. In some embodiments, the source gates 108 and the drain gates 110 are conductive gates including one or more bulk conductive gate material(s) deposited over the dielectric layer 106. The bulk gate material can include any suitable conducting material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), conductive carbon, graphene, or any suitable combination of these materials. The conductive gate materials can further include dopants that are incorporated during or after deposition.

The source gates 108 and the drain gates 110 can be formed using any suitable process, such as, for example, chemical vapor deposition (CVD), plasma-enhanced CVD (PECVD), ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), atomic layer deposition (ALD), flowable CVD, physical vapor deposition (PVD), molecular beam epitaxy (MBE), chemical solution deposition, or other like process. In some embodiments, the source gates 108 and the drain gates 110 are formed by ALD and/or LPCVD, followed by electron beam lithography (e-beam lithography), thermal scanning probe lithography (tSPL), and/or dry etching to define the final gate patterns. In some embodiments, the source gates 108 and the drain gates 110 are patterned to define source/drain gates which cover opposite ends, respectively, of the substrate 104/dielectric layer 106 and which wrap over the sidewalls of the fin 102.

A pair of plunger gates 112 (also referred to as dot plunger gates) are formed between the source gates 108 and the drain gates 110. The plunger gates 112 can be formed of a similar conductive material and in similar manner as the source gates 108 and the drain gates 110, although the plunger gates 112 are not limited to the same materials and deposition techniques and all such configurations are within the contemplated scope of this disclosure.

As further shown in FIG. 1, the source gates 108, the drain gates 110, and the plunger gates 112 do not wrap-around a topmost surface 114 (shown via projection through the dielectric layer 106) of the fin 102. Instead, the source gates 108, the drain gates 110, and the plunger gates 112 extend along a portion of the sidewalls of the fin 102. In some embodiments, the plunger gates 112 are etched back from the topmost surface 114 of the fin 102 to expose a surface of the underlying dielectric layer 106. In some embodiments, only the plunger gates 112 are etched back. In some embodiments, the source gates 108 and the drain gates 110 are also etched back from the topmost surface 114 of the fin 102 to expose a surface of the underlying dielectric layer 106 (as shown).

In some embodiments, the plunger gates 112 (or alternatively, the source gates 108, the drain gates 110, and the plunger gates 112) are partially removed to expose a portion of the dielectric layer 106 to a height H of 5 nm to 20 nm, for example, 10 nm. Advantageously, configuring the fin 102 with tapered sidewalls and the plunger gates 112 with a partial etch-back in this manner ensures that a quantum dot forms in the fin 102 despite the absence of a wrap-around plunger gate and that the resultant quantum dot is not screened by metallic materials in the plunger gate, the source gate, and the drain gate (typically metal gates). Moreover, the fact that the fin 102 has tapered sidewalls ensures that the quantum dot will preferentially form at the top of the fin 102, rather than along its sidewalls (along the height of the fin 102) or at the base of the fin. This configuration can be referred to as a "side-gated" fin-type FET. Advantageously, the height H can be adjusted to fine-tune the location of the resulting quantum dot depending on the fin configuration (height, degree of taper, base width, tip width) and needs of a given application.

Figure 2:
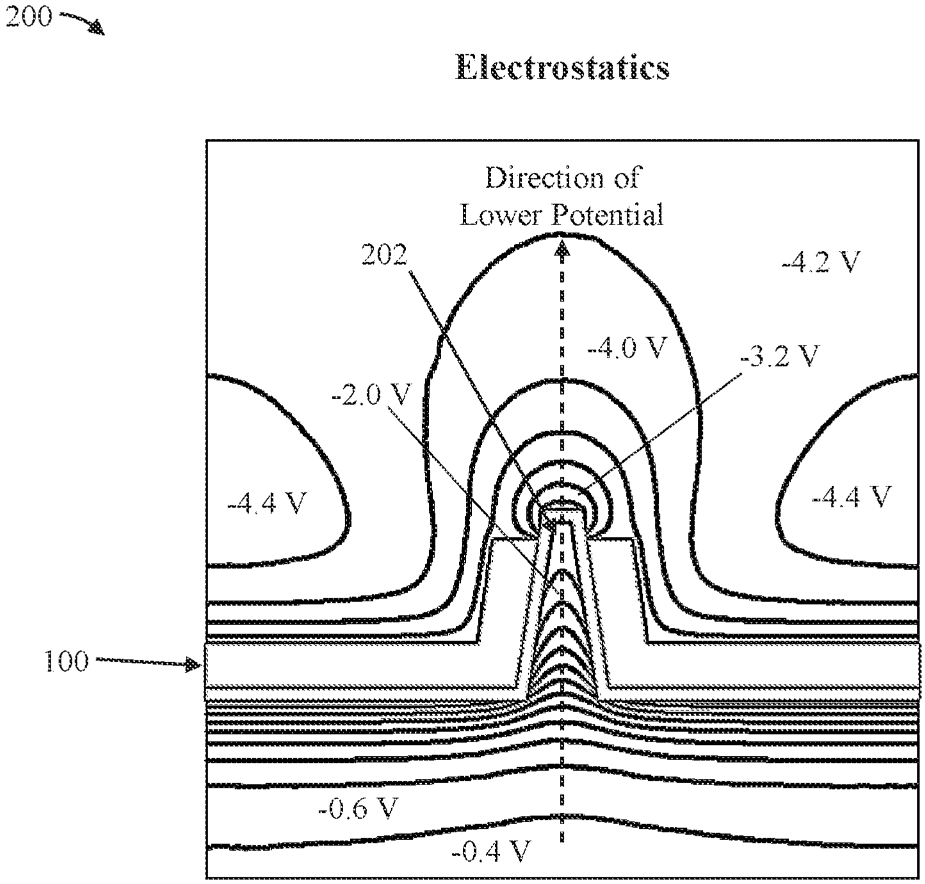
FIG. 2 is an electrostatics simulation of the scanning single electron transistor of FIG. 1 in accordance with one or more embodiments of the disclosure.

In some embodiments, ohmic contacts (not separately shown) are formed to electrically contact two-dimensional electron (or hole) gas that will be formed beneath the source gates 108 and the drain gates 110 (refer to FIG. 2 for electrostatics). In some embodiments, the scanning single electron transistor 100 is incorporated within a tip of a tuning-fork-based scanning probe (refer to FIG. 6).

FIG. 2 depicts an electrostatics simulation 200 of the scanning single electron transistor 100 of FIG. 1 in accordance with one or more embodiments of the disclosure. For the electrostatics simulation 200, the source and drain gates (e.g., the source gates 108 and the drain gates 110) are biased at −5 V, while the dot plunger gates (e.g., the plunger gates 112) are biased at −3.5 V. For the electrostatic simulations, a thin (e.g., 5 nm thick) metallic layer is inserted at the oxide-semiconductor interface beneath the source and drain gates to represent the two-dimensional hole gas that will form beneath these gates under these biasing conditions. In the electrostatic simulations, this metallic layer is biased at 0 V. The potential within the fin can then be calculated and a resultant plot for a perpendicular slice through the middle of the fin (along the XZ plane) is illustrated. As shown in FIG. 2, holes 202 will first accumulate at the top of the fin (e.g., the fin 102), where the potential is lowest. Performing the electrostatic simulations with positive voltages (+5V on the source gates 108 and drain gates 110 and +3.5V on the plunger gates 112) results in a similar potential distribution within the fin with electrons accumulating at the top of the fin.

Figure 3:
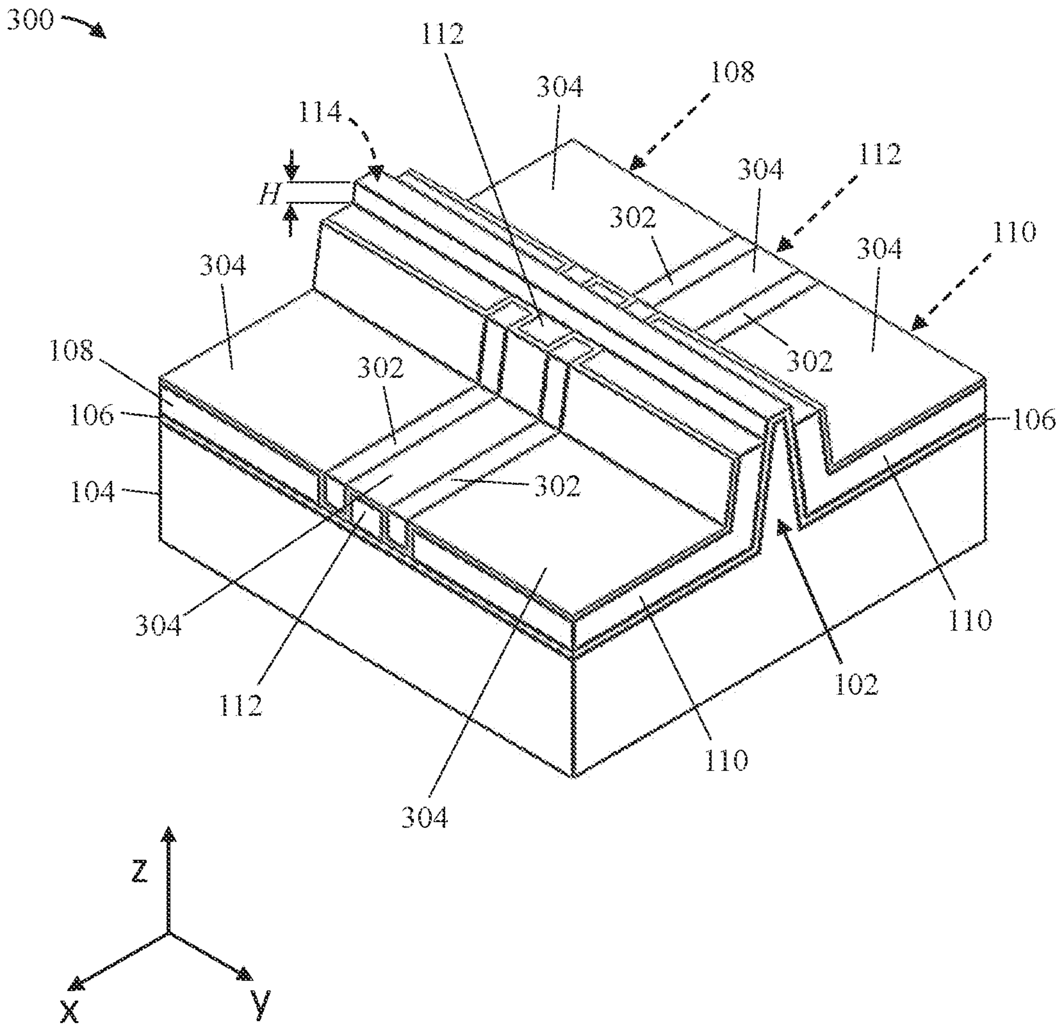
FIG. 3 is a view of a scanning single electron transistor in accordance with one or more embodiments of the disclosure.

FIG. 3 depicts a view of a scanning single electron transistor 300 in accordance with one or more embodiments of the disclosure. The scanning single electron transistor 300 represents an alternative geometry from the scanning single electron transistor 100 shown in FIG. 1. As shown in FIG. 3, the scanning single electron transistor 300 includes a fin 102 formed on a substrate 104, source gates 108, drain gates 110, and plunger gates 112, each formed and configured in a similar manner as described previously with respect to the scanning single electron transistor 100 shown in FIG. 1, except that the scanning single electron transistor 300 includes barrier gates 302. Advantageously, the barrier gates 302 allow for additional tuning of the tunnel rates between the quantum dot and its reservoirs (e.g., location of the quantum dot, refer to FIG. 2).

In some embodiments, the barrier gates 302 are formed over the substrate 104 between the source gates 108 and the plunger gates 112 and between the drain gates 110 and the plunger gates 112. For example, in the configuration shown in FIG. 3, there are two source gates 108, two drain gates 110, two plunger gates 112, and four barrier gates 302. The barrier gates 302 can be formed of a similar conductive material and in similar manner as the source gates 108, the drain gates 110, and/or the plunger gates 112, although the barrier gates 302 are not limited to the same materials and deposition techniques and all such configurations are within the contemplated scope of this disclosure.

In some embodiments, a dielectric layer 304 is formed between the barrier gates 302 and the remaining components (e.g., the source gates 108, drain gates 110, plunger gates 112, etc.) of the scanning single electron transistor 300. In some embodiments, the dielectric layer 304 is a high-quality, thermally-grown dielectric layer, such as, for example, a thermally-grown silicon dioxide layer. In some embodiments, the dielectric layer 304 is formed to a thickness of 0.5 to 10 nm, for example 5 nm, although other thicknesses are within the contemplated scope of this disclosure. In some embodiments, the dielectric layer 304 is a high-k dielectric film, in a similar manner as described with respect to the dielectric layer 106.

Figure 4:
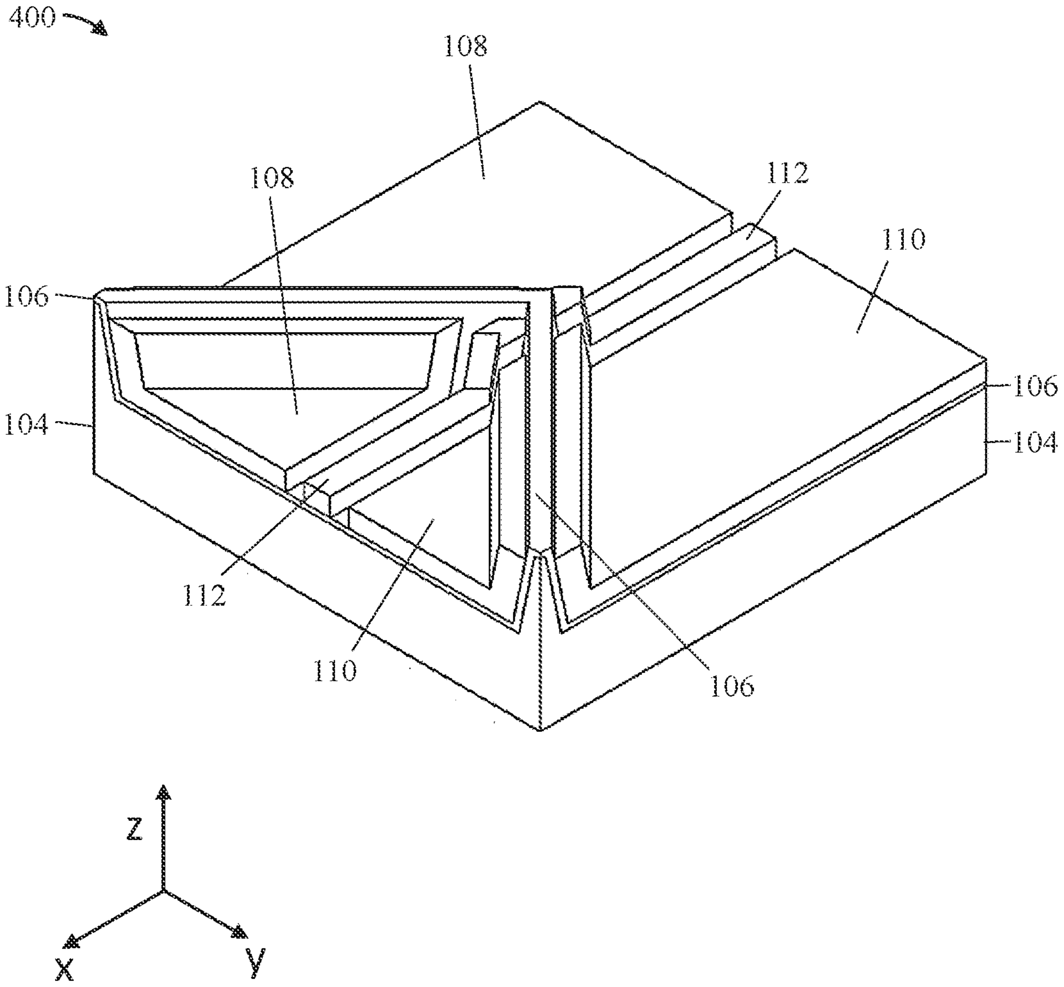
FIG. 4 is a view of a scanning single electron transistor in accordance with one or more embodiments of the disclosure.

FIG. 4 depicts a view of a scanning single electron transistor 400 in accordance with one or more embodiments of the disclosure. The scanning single electron transistor 400 represents yet another alternative geometry from the scanning single electron transistor 100 shown in FIG. 1. As shown in FIG. 4, the scanning single electron transistor 400 includes a fin 102 formed on a substrate 104, source gates 108, drain gates 110, and plunger gates 112, each formed and configured in a similar manner as described previously with respect to the scanning single electron transistor 100 shown in FIG. 1, except that the scanning single electron transistor 400 is built in an angled configuration. More specifically, rather than using a linear fin geometry (refer to FIGS. 1 and 3), the fins 102 can be formed at an angle (as shown, 90 degrees).

Observe that, due to the inclination angle (e.g., typically 10 degrees) of a chip in an AFM setup (refer to FIG. 6), the corner of an angled fin will be relatively closer to a device under test than a linerally formed fin. Consequently, an angled fin geometry, such as that shown in FIG. 4, facilitates bringing the SET into a relatively closer proximity to a point of interest (e.g., to a sample).

The particular angled fin geometry shown in FIG. 4 (i.e., one having a 90 degree orientation) is provided for ease of discussion and illustration only. Scanning single electron transistors can be formed having any arbitrary fin angle geometries as desired to accommodate the needs of any given application and all such configurations are within the contemplated scope of this disclosure. Moreover, tunnel barrier gates (refer to FIG. 3) can be incorporated within device layouts having angled fin geometrics in a similar manner as previously described with respect to linear fin geometries.

Figure 5:
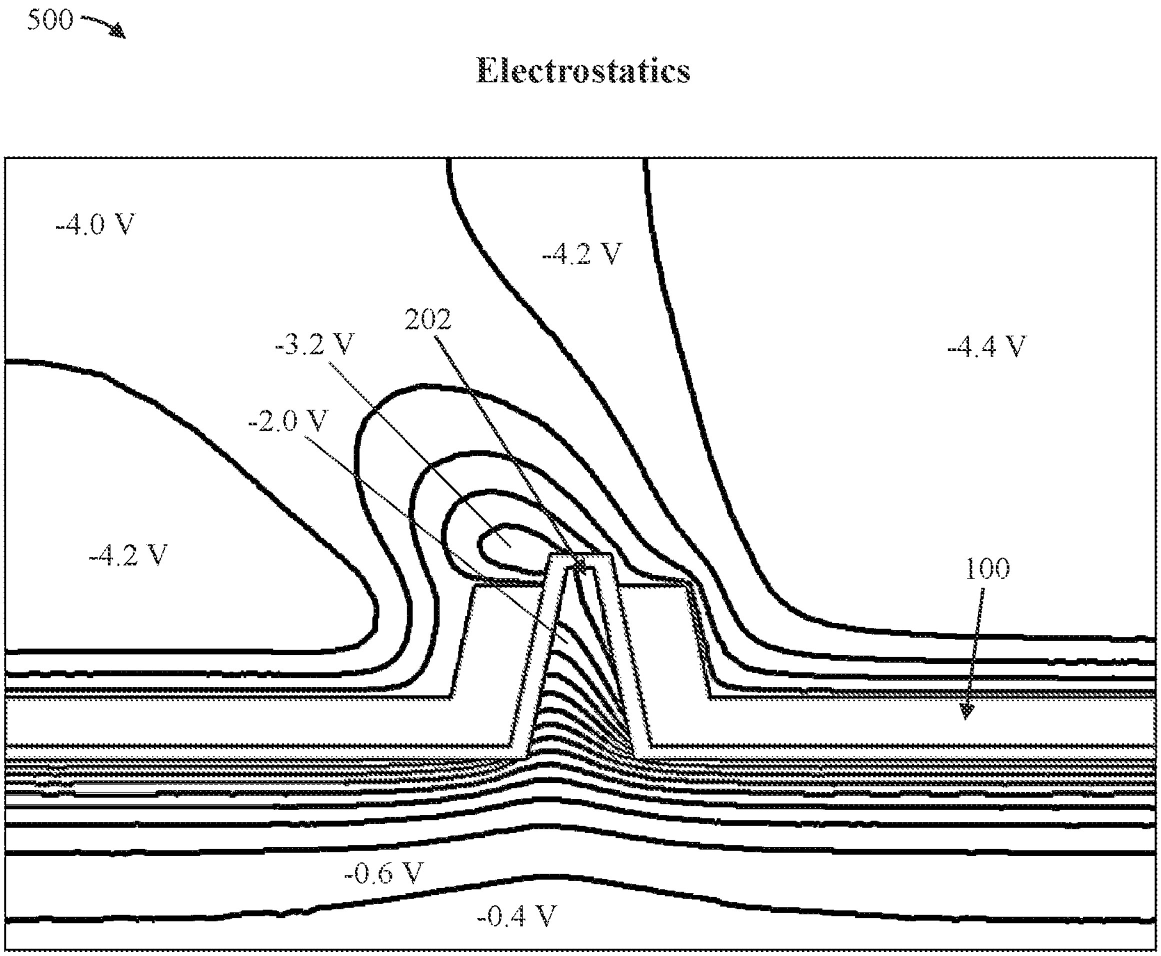
FIG. 5 is an electrostatics simulation of the scanning single electron transistor of FIG. 4 in accordance with one or more embodiments of the disclosure.

FIG. 5 depicts an electrostatics simulation 500 of the scanning single electron transistor 400 of FIG. 4 in accordance with one or more embodiments of the disclosure. For the electrostatics simulation 500, the source and drain gates (e.g., the source gates 108 and the drain gates 110) are biased at −5 V, while the dot plunger gates (e.g., the plunger gates 112) are biased at −3.5 V. In the electrostatic simulations, a thin (e.g., 5 nm thick) metallic layer is inserted at the oxide-semiconductor interface beneath the source and drain gates to represent the two-dimensional hole gas that will form beneath these gates under these biasing conditions. In the electrostatic simulations, this metallic layer is biased at 0 V. The potential within the fin can then be calculated and a resultant plot for a perpendicular slice through the middle of the fin (along the XZ plane) is illustrated. As shown in FIG. 5, the holes 202 will accumulate at an outer edge of the bend in the fin rather than centered in the top of the fin (compare to FIG. 2) due to the angled fin geometry. Advantageously, shifting the holes 202 to the outer fin edge further reduces a risk of mis-forming the quantum dot (for example, of forming two parallel quantum dots at the sides of the fin rather than a single quantum dot in the fin center).

Figure 6:
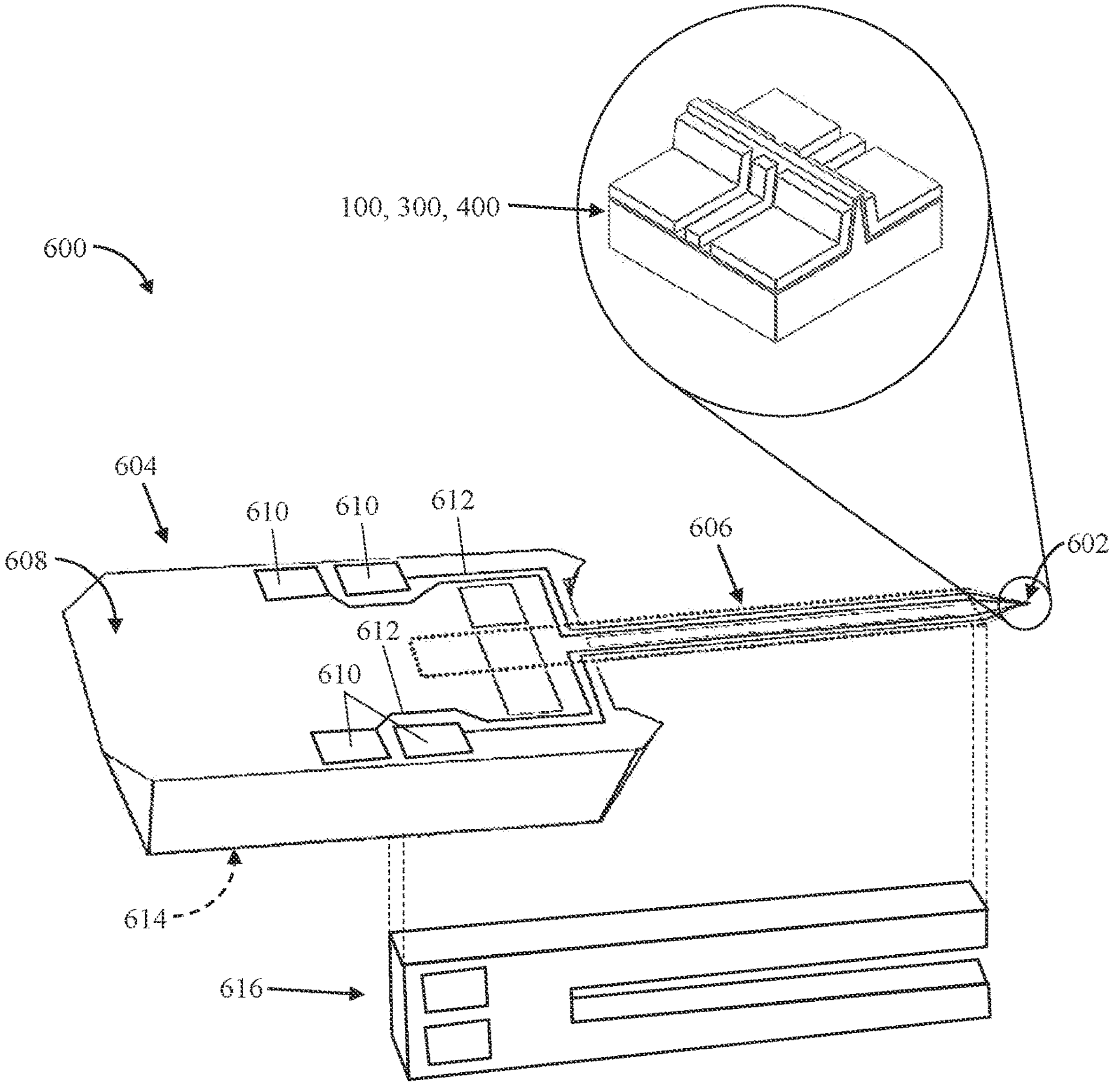
FIG. 6 is a view of a tuning-fork-based scanning probe in accordance with one or more embodiments of the disclosure.

FIG. 6 depicts a view of a tuning-fork-based scanning probe 600 in accordance with one or more embodiments of the disclosure. As shown in FIG. 6, the tuning-fork-based scanning probe 600 includes a scanning single electron transistor (e.g., the scanning single electron transistor 100, 300, 400 described previously) incorporated on a tip 602 of a holding chip 604. The tip 602 extends from the holding chip 604 along a cantilever 606.

In some embodiments, a top side 608 of the holding chip 604 includes one or more photolithographically patterned bonding pads 610 and electrodes 612 electrically coupled to the scanning single electron transistor on the tip 602. In some embodiments, a bottom side 614 is vertically integrated with a tuning fork 616 to define a self-actuated, self-sensing probe.

Constructing the tuning-fork-based scanning probe 600 in this manner provides a number of benefits over prior sensing probes. In particular, the tuning-fork-based scanning probe 600 offers a higher vertical resolution than prior scanning electrometers. Moreover, the tuning-fork-based scanning probe 600 can be used to record an electric field distribution across active devices with unprecedented resolution and bandwidth. From this field distribution it can be possible to study charge transport modes, defects, and local resistivities of samples at low temperature. In addition, the tuning-fork-based scanning probe 600 can be used for detecting two-level-systems (TLS), which, without wishing to be bound by theory, are understood to be a main source of loss of coherence in semiconducting spin qubits. The spatial resolution offered by the tuning-fork-based scanning probe 600 (e.g., less than 20 nm) is sufficient to discriminate subsets of defects and to identify their spectrum.

The tuning-fork-based scanning probe 600 and/or the scanning single electron transistor 100, 300, 400 described previously can be modified to include additional gates that can be used to induce a quantum dot and/or qubits in a sample under study. The tuning-fork-based scanning probe 600 can be used to read out induced quantum dots and can further be used to study any variability in qubit properties (e.g., spin-orbit coupling, valley splitting, etc.) as a function of location, proximity to disclinations or other defects, influence of strain at boundaries, etc., which are known to vary dramatically despite being fabricated in the same way on the same substrate. Further, tuning-fork-based scanning probe 600 leveraging scanning single electron transistors having angled fin geometrics offer further applications in the field of semiconducting spin qubits as an alternative to geometries currently used for single electron (or hole) confinement. Advantageously, the tuning-fork-based scanning probe 600 described herein natively avoids the use of laser light detection schemes, which are limited in application as the laser light itself can affect the performance of SETs and can interfere with the sample under measure.

Figure 7:
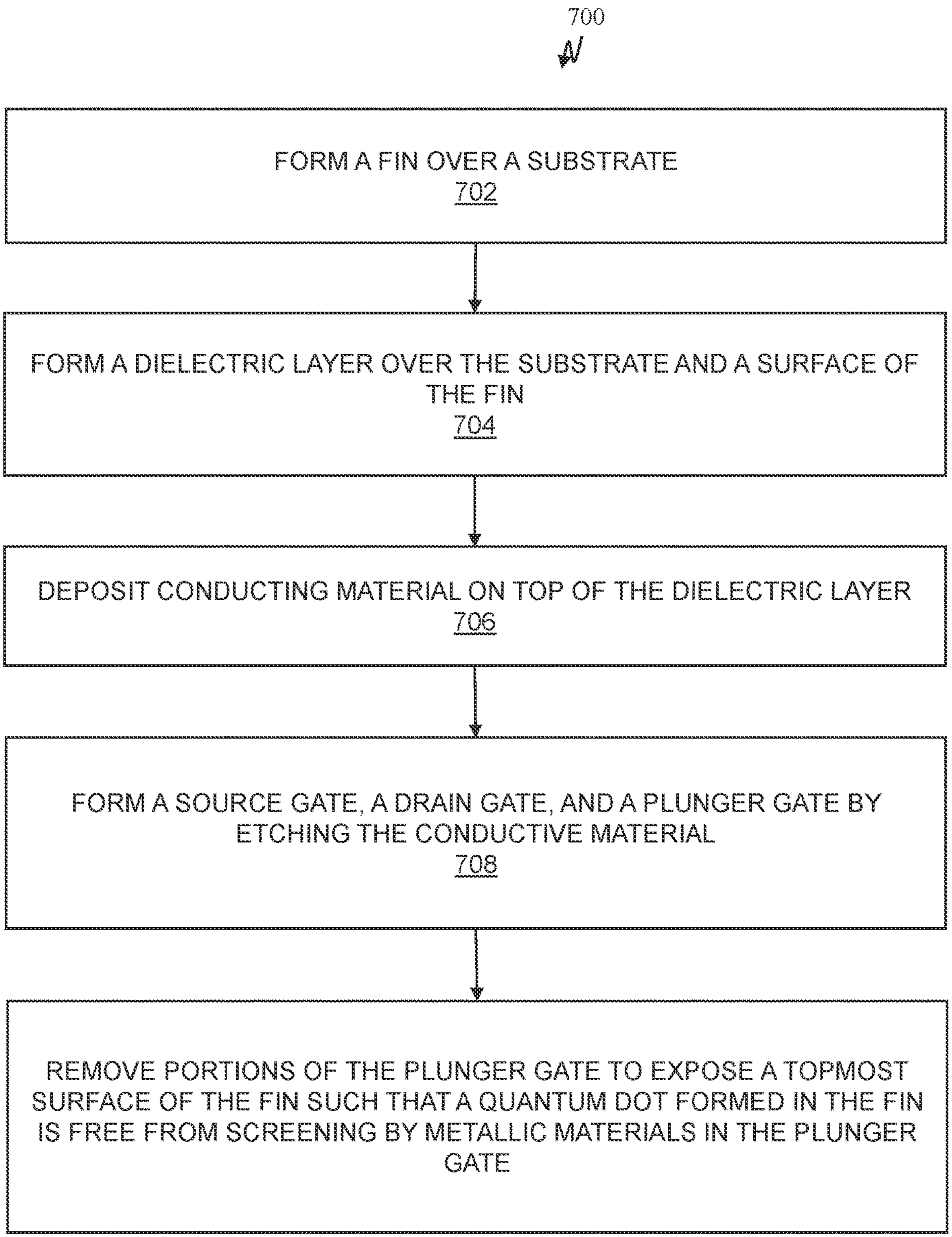
FIG. 7 depicts a flow diagram illustrating a method according to one or more embodiments of the disclosure.

FIG. 7 depicts a flow diagram illustrating a method 700 according to one or more embodiments of the disclosure. As shown at block 702, the method includes forming a fin over a substrate. In some embodiments, the fin has a base portion (a widest portion) having a first width and a top portion (a narrowest portion) having a second width less than the first width. In some embodiments, the second width is less than 20 nanometers. In some embodiments, the second width is less than 10 nanometers. In some embodiments, the second width is less than 5 nanometers. In some embodiments, the second width is less than 2 nanometers. In some embodiments, the second width is less than 1 nanometer.

At block 704, the method includes forming a dielectric layer (e.g., the dielectric layer 106) over the substrate and a surface of the fin. In some embodiments, the dielectric layer is formed by thermal oxidation of the substrate and covers the entire surface of the substrate and fin (e.g., the substrate 104 and the fin 102).

At block 706, the method includes depositing conducting material on top of the dielectric layer. This conducting material will serve to form the source gate 108 and the drain gate 110. In some embodiments, the conducting material will also serve to form the plunger gates 112. In some embodiments, the conducting material is a metal. In other embodiments, the conducting material is a highly-doped semiconductor.

At block 708, the method includes forming a source gate, a drain gate, and a plunger gate by etching the conductive material, the source gate, the drain gate, and the plunger gate each extending up sidewalls and over a top of the fin. In some embodiments, the plunger gate 112 is also formed from the same material. The gates (the source gate, drain gate, and plunger gate) extend up the sidewalls of the fin and over the top of the fin.

At block 712, the method includes removing portions of the plunger gate to expose a topmost surface of the fin such that a quantum dot formed in the fin is free from screening by metallic materials in the plunger gate. In some embodiments, the plunger gate, the source gate, and the drain gate are etched back from the topmost surface of the fin to a height of 10 nanometers.

In some embodiments, the method includes forming ohmic contacts. In some embodiments, the ohmic contacts are used to contact the two-dimensional electron gas. In other embodiments, the ohmic contacts contact the two-dimensional hole gas.

In some embodiments, the method includes forming a dielectric layer directly on the substrate and directly on the fin. In some embodiments, the plunger gate, the gate, and the drain gate are directly on the dielectric layer. In some embodiments, a portion of the dielectric layer is exposed on the topmost surface of the fin.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form.

Various embodiments of the present disclosure are described herein with reference to the related drawings. Alternative embodiments can be devised without departing from the scope of this disclosure. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present disclosure is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term “direct contact” means that a first element, such as a first structure, and a second element, such as a second structure, are connected without any intermediary conducting, insulating or semiconductor layers at the interface of the two elements.

Spatially relative terms, e.g., “beneath,” “below,” “lower,” “above,” “upper,” and the like, are used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as “below” or “beneath” other elements or features would then be oriented “above” the other elements or features. Thus, the term “below” can encompass both an orientation of above and below. The device can be otherwise oriented (e.g., rotated 90 degrees or at other orientations), and the spatially relative descriptors used herein should be interpreted accordingly.

The terms “about,” “substantially,” “approximately,” and variations thereof, are intended to include the degree of error associated with measurement of the particular quantity based upon the equipment available at the time of filing the application. For example, “about” can include a range of +8% or 5%, or 2% of a given value.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present disclosure will now be provided. Although specific fabrication operations used in implementing one or more embodiments of the present disclosure can be individually known, the described combination of operations and/or resulting structures of the present disclosure are unique. Thus, the unique combination of the operations described in connection with the fabrication of a semiconductor device according to the present disclosure utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present disclosure. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present disclosure have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A scanning single electron transistor comprising:

a fin formed over a substrate, the fin extending from the substrate in a first direction and having a peak width of less than 20 nanometers, the fin tapered such that a base width of the fin is greater than the peak width;

a first gate over a first portion of the substrate, the first gate extending over a sidewall of the fin;

a second gate over a second portion of the substrate, the second gate extending over the sidewall of the fin; and a plunger gate over a third portion of the substrate, the plunger gate extending over the sidewall of the fin, the plunger gate between the first gate and the second gate;

wherein the plunger gate is etched back to expose a topmost surface of the fin and a portion of the sidewall of the fin such that a quantum dot formed in the fin is free from screening by metallic materials in the plunger gate.

2. The scanning single electron transistor of claim 1, further comprising a dielectric layer directly on the substrate and directly on the fin.

3. The scanning single electron transistor of claim 2, wherein the plunger gate, the first gate, and the second gate are directly on the dielectric layer.

4. The scanning single electron transistor of claim 2, wherein a portion of the dielectric layer is exposed on the topmost surface of the fin.

5. The scanning single electron transistor of claim 1, wherein the plunger gate, the first gate, and the second gate are etched back from the topmost surface of the fin to a height of 10 nanometers.

6. The scanning single electron transistor of claim 1, wherein the fin comprises a base portion having a first width and a top portion having a second width less than the first width.

7. The scanning single electron transistor of claim 6, wherein the second width of the top portion is less than 20 nanometers.

8. A tuning-fork-based scanning probe comprising:

a holding chip comprising a cantilever;

a tuning fork coupled to a bottom surface of the holding chip; and a scanning single electron transistor on a tip of the cantilever, the scanning single electron transistor comprising:

a fin formed over a substrate;

a first gate over a first portion of the substrate, the first gate extending over a sidewall of the fin;

a second gate over a second portion of the substrate, the second drain gate extending over the sidewall of the fin; and a plunger gate over a third portion of the substrate, the plunger gate extending over the sidewall of the fin, the plunger gate between the first gate and the second gate;

wherein the plunger gate is etched back to expose a topmost surface of the fin such that a quantum dot formed in the fin is free from screening by metallic materials in the plunger gate.

9. The tuning-fork-based scanning probe of claim 8, further comprising a dielectric layer directly on the substrate and directly on the fin.

10. The tuning-fork-based scanning probe of claim 9, wherein the plunger gate, the first gate, and the second gate are directly on the dielectric layer.

11. The tuning-fork-based scanning probe of claim 9, wherein a portion of the dielectric layer is exposed on the topmost surface of the fin.

12. The tuning-fork-based scanning probe of claim 8, wherein the plunger gate, the first gate, and the second gate are etched back from the topmost surface of the fin to a height of 10 nanometers.

13. The tuning-fork-based scanning probe of claim 8, wherein the fin comprises a base portion having a first width and a top portion having a second width less than the first width.

14. The tuning-fork-based scanning probe of claim 13, wherein the second width of the top portion is less than 20 nanometers.

15. A method comprising:

forming a fin over a substrate;

forming a dielectric layer over the substrate and a surface of the fin;

depositing conducting material on top of the dielectric layer;

forming a first gate, a second gate, and a plunger gate by etching the conductive material, the first gate, the second gate, and the plunger gate each extending up sidewalls and over a top of the fin; and removing portions of the plunger gate to expose a topmost surface of the fin such that a quantum dot formed in the fin is free from screening by metallic materials in the plunger gate.

16. The method of claim 15, wherein the dielectric layer is formed directly on the substrate and directly on the fin.

17. The method of claim 16, wherein the plunger gate, the first gate, and the second gate are directly on the dielectric layer.

18. The method of claim 16, wherein a portion of the dielectric layer is exposed on the topmost surface of the fin.

19. The method of claim 15, wherein the plunger gate, the first gate, and the second gate are etched back from the topmost surface of the fin to a height of 10 nanometers.

20. The method of claim 15, wherein the fin comprises a base portion having a first width and a top portion having a second width less than the first width.

* * * * *